(12) United States Patent
Hopf et al.

(10) Patent No.: US 11,276,786 B2
(45) Date of Patent: Mar. 15, 2022

(54) SOLAR MODULE AND ENERGY-GENERATING SYSTEM

(71) Applicant: SMA Solar Technology AG, Niestetal (DE)

(72) Inventors: Markus Hopf, Espenau (DE); Burkard Mueller, Kassel (DE); Oliver Prior, Marsberg (DE)

(73) Assignee: SMA Solar Technology AG, Niestetal (DE)

( * ) Notice: Subject to any disclaimer, the term of this patent is extended or adjusted under 35 U.S.C. 154(b) by 0 days.

(21) Appl. No.: 16/352,093

(22) Filed: Mar. 13, 2019

(65) Prior Publication Data

US 2019/0214511 A1 Jul. 11, 2019

Related U.S. Application Data

(63) Continuation of application No. PCT/EP2017/072989, filed on Sep. 13, 2017.

(30) Foreign Application Priority Data

Sep. 13, 2016 (DE) .......................... 102016117229.4

(51) Int. Cl.
*H01L 31/00* (2006.01)
*H01L 31/02* (2006.01)
(Continued)

(52) U.S. Cl.
CPC .... *H01L 31/02021* (2013.01); *H01L 31/0443* (2014.12); *H02H 7/20* (2013.01); *Y02E 10/50* (2013.01)

(58) Field of Classification Search
CPC ...................... H01L 31/02021; H01L 31/0443
See application file for complete search history.

(56) References Cited

U.S. PATENT DOCUMENTS

| 9,377,765 B2 | 6/2016 | Makhota et al. |
| 2011/0079263 A1* | 4/2011 | Avrutsky ................ H02J 7/35 |
| | | 136/244 |

(Continued)

FOREIGN PATENT DOCUMENTS

| DE | 102011079074 A1 | 1/2013 |
| JP | 2011249790 A | 12/2011 |

OTHER PUBLICATIONS

International Search Report dated Nov. 24, 2017 in connection with International Application PCT/EP2017/072989.

(Continued)

*Primary Examiner* — Angelo Trivisonno
(74) *Attorney, Agent, or Firm* — Eschweiler & Potashnik, LLC

(57) ABSTRACT

A solar module includes a safety circuit, and a series circuit of bypass diodes, which is arranged between solar module connections, wherein the bypass diodes have bypass connections at both ends and all connecting points of the series circuit of bypass diodes. The solar module also includes a series circuit of solar partial modules having partial module terminals at both ends and all connecting points of the series circuit of solar partial modules, wherein each bypass diode is associated with precisely one solar partial module, and a plurality of semiconductor switches configured to disconnect the solar module connections from voltage at an associated partial module terminal when a disconnection signal is received by the safety circuit. Each of the plurality of semiconductor switches is configured to switch a solar partial module associated therewith into a voltage-free or current-free state, and at least one bypass connection is directly connected to an associated partial module terminal and at least one bypass connection is connected to an (Continued)

associated partial module terminal by means of one of the semiconductor switches.

19 Claims, 3 Drawing Sheets

(51) Int. Cl.
    *H01L 31/0443*    (2014.01)
    *H02H 7/20*        (2006.01)

(56) References Cited

U.S. PATENT DOCUMENTS

| 2013/0002335 A1* | 1/2013 | DeGraaff | H02J 3/0073 |
| | | | 327/419 |
| 2014/0375145 A1* | 12/2014 | Volz | H03K 17/94 |
| | | | 307/326 |
| 2015/0381108 A1 | 12/2015 | Hoeft et al. | |
| 2015/0381111 A1* | 12/2015 | Nicolescu | H02H 1/0015 |
| | | | 361/3 |

OTHER PUBLICATIONS

International Preliminary Report on Patentability dated Mar. 19, 2019 in connection with International Application PCT/EP2017/072989.

\* cited by examiner

SOLAR MODULE AND ENERGY-GENERATING SYSTEM

CROSS REFERENCE TO RELATED APPLICATIONS

This application is a continuation of International Patent Application number PCT/EP2017/072989, filed on Sep. 13, 2017, which claims priority to German Patent Application number 102016117229.4, filed on Sep. 13, 2016, and is hereby incorporated by reference in its entirety.

FIELD

The disclosure relates to a solar module with independently disconnecting partial modules, and also to an energy-generating system using solar modules of this kind.

BACKGROUND

In photovoltaic energy-generating systems, individual solar modules are connected to one another in series or in parallel in order to then supply voltages and currents which assume far higher values than those of an individual solar module. In the event of a fault or emergency, it is desirable to break this interconnection in response to a disconnection signal in such a way that it is ensured that dangerous voltages do not occur at any point in the energy-generating system.

Therefore, DE 10 2006 060 815 A1 discloses providing each solar module with its own circuit breaker or short-circuiting device, to switch the associated solar module to zero voltage in response to a disconnection signal emitted by an inverter. In this case, the circuit breaker or the short-circuiting device has to be designed at least for the total open circuit voltage of the solar module, typically 80 V. A more cost-effective and more operationally reliable variant would be to switch each of the individual partial modules, which make up the solar modules, to zero voltage, so that substantially more favorable switches which have to be designed only for the open circuit voltage of the partial modules, typically 30 V, can be used.

Therefore, for example, the active bypass diodes disclosed in WO 2006/125664 A1 for use in the event of individual solar modules being in the shade can be used, said active bypass diodes having a suitable semiconductor switch with which partial modules can also be bridged. However, this leads to the disadvantage that the solar module cannot make any contribution to supplying power to a safety circuit for actuating the semiconductor switches when bridging is activated, and therefore another energy source has to be used, this creating additional costs.

SUMMARY

The present disclosure is directed to a solar module and, respectively, an energy-generating system which meet safety criteria in the event of disconnection being required and can be produced in a cost-effective manner.

One embodiment of the disclosure relates to a solar module comprising a series circuit of bypass diodes, which is arranged between solar module connections, wherein the bypass diodes have bypass connections at both ends and all connecting points of the series circuit of bypass diodes. Furthermore, in one embodiment the solar module comprises a series circuit of solar partial modules having partial module terminals at both ends and all connecting points of the series circuit of solar partial modules, wherein each bypass diode is associated with precisely one solar partial module. A plurality of semiconductor switches is provided for disconnecting the solar module connections from voltage at an associated partial module terminal when a disconnection signal is received by a safety circuit, wherein each of the plurality of semiconductor switches is configured to switch a solar partial module associated therewith to zero voltage or zero current. Therefore, at least as many semiconductor switches are used as there are solar partial modules. At least one bypass connection is directly connected to the associated partial module terminal and at least one bypass connection is connected to the associated partial module terminal by means of one of the semiconductor switches. This type of connection ensures that always at least one solar partial module is not short-circuited, even if the solar module is switched to zero voltage or zero current. The safety circuit is advantageously configured for energy supply from the voltage which is dropped across the partial module which is not short-circuited, so that the safety circuit does not require an independent energy supply. Even in the event of the solar module in which a current is directed across the solar module connections by means of the series circuit of the bypass diodes being in the shade, a voltage drop across the series circuit of the solar partial modules sufficient to supply power to the safety unit, can be achieved by opening the semiconductor switch connecting the bypass connection to the partial module terminal.

The semiconductor switches, the safety unit and the semiconductor diodes can be accommodated in one embodiment, as module electronics, in a housing, for example a junction box, on the rear side of the solar module and connected to the partial module terminals of the solar module series circuit protruding from the solar module there. For the most part, commercially available solar modules have three solar partial modules, however the disclosure can also be implemented when there are a different number of solar partial modules.

The number of semiconductor switches can correspond to the number of solar partial modules, so that each partial module can be switched to zero current or zero voltage by precisely one of the semiconductor switches. However, it is also possible for a plurality of semiconductor switches to be associated with one solar partial module and switch said solar partial module to zero current or zero voltage by alternate actuation or with supplementary actuation.

Since in each case one semiconductor switch switches an associated solar partial module to zero voltage or zero current, the maximum voltage loading on all or at least some of the semiconductor switches can be limited to the open circuit voltage of a solar partial module. As a result, it is possible to use substantially more cost-effective semiconductor switches than in the case of the entire solar module having to be switched to zero voltage by one switch. As a result, as switches with a lower internal resistance can also be selected, so that electrical losses can be reduced and therefore, in particular, the thermal loading on the components used can also be improved in the normal operating situation too.

At least one bypass diode is advantageously bridged by one of the semiconductor switches in the solar module, which one semiconductor switch is closed by the safety circuit when the disconnection signal is received in order to short-circuit the associated solar partial module and thereby make the solar partial module voltage-free. The solar partial module to be short-circuited is, in one embodiment, in an inner position of the series circuit of the solar modules, that is to say not at one of the ends of the series circuit. It is conceivable to also close the semiconductor switch when the bridged bypass diode is carrying a current, for example caused by the associated solar partial module being in the shade. In this case, this semiconductor switch then acts like an active freewheeling diode and reduces the voltage drop across the bypass diode, this in turn leading to the bypass diode and all of the module electronics being relieved of thermal loading.

In one embodiment of the disclosure, the semiconductor switch which connects the at least one bypass connection to the associated partial module terminal is directly connected to one of the solar module connections. As a result, a solar partial module at one end of the solar module series circuit can also provide a supply voltage for the safety unit when the solar module is switched to zero voltage. Some or all of the remaining solar partial modules can then be short-circuited by semiconductor switches which bridge the bypass diode in order to switch the solar module to zero voltage. In one embodiment, each solar module connection is directly connected in each case to a semiconductor switch which connects a bypass connection to the associated solar partial module terminal, so that the two outer solar partial modules, that is to say the solar partial modules situated closest to the solar module connections, can then provide a supply voltage for the safety unit. The solar partial module or solar partial modules which is/are arranged between the two outer solar partial modules is/are then, in one embodiment, configured such that it/they can be short-circuited by semiconductor switches which bridge the associated bypass connections.

If a solar partial module is configured such that it can be short-circuited by a semiconductor switch which bridges the associated bypass connections, it is desired in one embodiment for these bypass connections to be directly connected to the associated partial module terminals, that is to say to not provide any semiconductor switches in the connection. The adjacent solar partial modules can then likewise be designed as solar partial modules which can be short-circuited, or a semiconductor switch can be arranged between the corresponding partial module terminal and the bypass connection on that side of the adjacent solar partial module which is averted from the solar partial module which is designed such that it can be short-circuited. In this way, the corresponding semiconductor switches, in respect of their voltage rating, only have to be designed for the open circuit voltage of a solar partial module.

If operational reliability is required, a further, redundant semiconductor switch can be connected in parallel with the first semiconductor switch which bridges the bypass diode in one embodiment. The two semiconductor switches can be jointly operated by the safety circuit, or the redundant semiconductor switch is only operated when the first semiconductor switch is not functioning correctly. It is advantageous in one embodiment to use in each case one normally open and one normally closed switch for the first and the further, redundant semiconductor switch. In this way, it is possible to also short-circuit the solar partial module when the safety unit cannot be supplied with enough energy, for example at dusk. At the same time, it is possible to use the lower internal resistance of a normally open switch in relation to a normally closed switch so as to reduce losses. However, it is also conceivable to avoid the use of a redundant semiconductor switch by virtue of the safety circuit being configured such that, even at a low voltage which is generated by the solar partial modules, it is ready for operation and closes the semiconductor switch or semiconductor switches which is/are arranged in parallel with the bypass diodes, so that the voltage which is generated by solar partial modules which are associated with the semiconductor switches is not applied to the solar module connections.

The semiconductor switches can be configured in one embodiment as IGBTs or as field-effect transistors, in particular as MOSFETs, and have an intrinsic or a separate freewheeling diode. They can be designed as normally open or normally closed transistors, wherein the semiconductor switches which are arranged between the bypass connection and the partial module terminal can, in one embodiment, be normally closed switches and the semiconductor switches which are arranged in parallel with the bypass diodes can, in one embodiment, be normally open switches.

The solar module according to the disclosure can, in one embodiment, be used within an energy-generating system. In particular, all solar modules of the energy-generating system can be designed according to the disclosure. The disconnection signal can be generated centrally, as a result of which all solar modules can be switched to zero voltage quickly and reliably when required.

The disconnection signal can also be configured as a dead man's signal, so that the solar modules are switched to zero voltage after they have not received a dead man's signal for a prespecified period of time.

In addition to the disconnection signal, the safety circuit of the solar module according to the disclosure can also be configured to receive a signal for reducing the voltage. When this signal is received, the safety circuit can remove some of the partial modules from the energy-generating process in a targeted manner by actuating the semiconductor switches associated with the partial modules, as a result of which the voltage applied to the solar module connections is reduced. It is likewise conceivable for the safety circuit to carry out removal of individual solar partial modules from the energy-generating process independently, for example by comparing the voltage which is dropped across the solar partial modules with prespecified threshold values, so that the voltage-reducing actuation of the semiconductor switches is performed by the safety circuit when the threshold values are exceeded.

An energy-generating system generally contains a plurality of series circuits of solar modules which are connected in parallel with one another. In a configuration of this kind, it is also important to take into account the situation of a reverse current, that is to say a current direction counter to the normal operating current direction which is produced when the voltage of one string exceeds the open circuit voltage of another string. A situation of this kind can also occur with solar modules according to the disclosure as a result of the solar modules not moving to a zero-voltage state at the same time when the disconnection signal is received. This can result in considerable reverse currents which have to be controlled. Therefore, in a solar module according to the disclosure, it is advantageous to initially open the semiconductor switches which are arranged between the bypass connections and the partial module terminals. The semiconductor switches which are arranged in parallel with the bypass diodes are only opened in this embodiment when it is ensured that no reverse current is flowing through the solar module. This condition is met, for example, when the voltage dropped across the semiconductor switch or semiconductor switches arranged in parallel with a bypass diode is equal to the voltage drop between the solar module connections. These conditions are, in one embodiment, checked by the safety circuit.

In the event of a reverse current, it is further advantageous to close the semiconductor switches arranged between the bypass connections and the partial module terminals in order to reduce the losses due to the freewheeling diodes of the semiconductor switches being energized.

BRIEF DESCRIPTION OF THE DRAWINGS

The disclosure and some of the variant embodiments of said disclosure will be explained in more detail below with the aid of figures, wherein.

DETAILED DESCRIPTION

Figure 1:
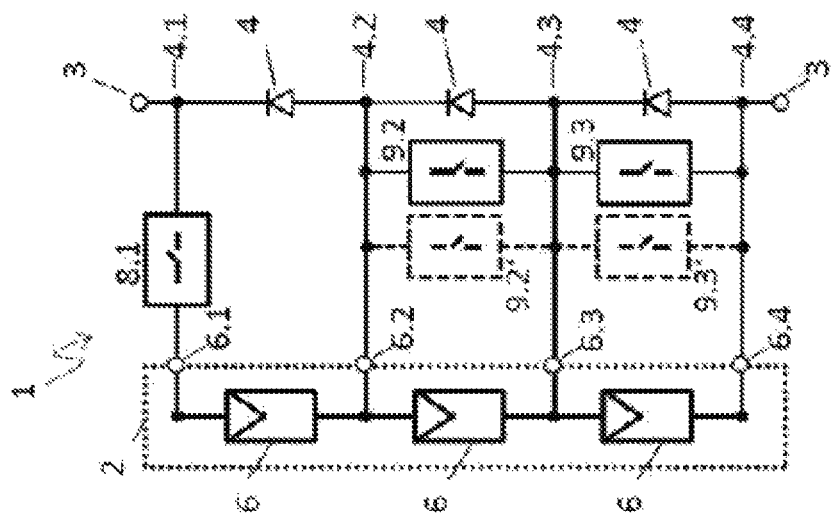
FIG. 1 shows a first embodiment according to the disclosure of a solar module.

FIG. 1 shows a solar module 1 according to the disclosure, having a series circuit of bypass diodes 4 being arranged between the solar module connections 3 of said solar module. Bypass connections 4.1 to 4.4 which are directly connected or connected by means of semiconductor switches 8.1 to 8.4 to corresponding partial module terminals 6.1 to 6.4 are provided between the bypass diodes 4. The partial module terminals 6.1 to 6.4 are electrical connections of a series circuit 2 of three partial modules 6 which, for their part, can have a series circuit of a plurality of solar cells. The partial module terminals 6.1 to 6.4 are arranged at the two ends and, respectively, at the connecting points between the partial modules 6. In addition, the central bypass diode 4 can be bridged by means of a semiconductor switch 9.2 arranged in parallel with said central bypass diode.

The semiconductor switches 8.1, 8.4 and 9.2 are jointly actuated by a safety unit 5. In the event of operation, the semiconductor switches 8.1 and 8.4 are closed, while the semiconductor switch 9.2 is open. In this case, the total voltage of the partial modules 6 is provided to the solar module connections 3 provided that the total voltage is positive. A string current supplied by means of the solar module connections across the series circuit of the bypass diodes 4 or over parts thereof flows only in the case of a negative total voltage which can occur, for example, in the event of the solar module 1 being in the shade if said solar module is arranged as part of a string in series connection with further solar modules and in parallel with further strings.

In the event of a dangerous situation or if it appears to be desirable for other reasons, the safety unit 5 receives a signal that the solar module 1 should be switched to a zero-voltage state. In this case, the safety unit 5, by means of corresponding switching signals 11, causes the semiconductor switches 8.1 and 8.4 to be opened and the semiconductor switch 9.2 to be closed. Owing to the semiconductor switch 9.2 being closed, the associated central partial module 6 of the series circuit 2 is short-circuited, while the outer partial modules 6 of the series circuit 2 are moved to the open circuit state, that is to say to a zero-current state. As a result, the solar module connections 3 are switched to zero voltage.

Even if a string current is further driven across the solar module connections 3, a maximum voltage drop at the level of double the value of the diode forward voltage of the bypass diodes 4 is produced between the solar module connections 3. Within the meaning of this disclosure, a low voltage drop of this kind is also referred to as the zero-voltage state.

In the zero-voltage state of the solar module, a maximum voltage at the level of the open circuit voltage of a partial module 6 is dropped across the open semiconductor switches 8.1 and 8.4. As a result, it is possible to use switches with a maximum operating voltage at the level of the open circuit voltage of a partial module for all semiconductor switches 8.1, 8.4 and 9.2 used. Designing the semiconductor switches for the open circuit voltage of the entire solar module 1 or even for yet higher values, for example for the maximum string voltage, is not necessary, as a result of which the costs of the semiconductor switches used are reduced to a fraction of the costs of semiconductor switches which can short-circuit or disconnect the entire solar module 1.

For the purpose of supplying energy to the safety unit 5, said safety unit is connected to the partial module terminals 6.1 and 6.4 via supply lines 12. Both in the operating situation and also in the zero-voltage state of the solar module 1, enough voltage for supplying energy to the safety unit 5, in this case at least double the value of a partial module voltage, is dropped between the partial module terminals 6.1 and 6.4. Therefore, an independent energy supply, for example a battery, is not required. It goes without saying that it is likewise conceivable to provide the supply lines 12 between the partial module terminals 6.1 and 6.2 or between the partial module terminals 6.3 and 6.4 and to use only one of the partial modules 6 for supplying energy to the safety unit 5.

The module electronics 7, here comprising the semiconductor switches 8.1, 8.4 and 9.2, and also the safety unit 5 and the bypass diodes 4, are in one embodiment jointly accommodated in a junction box on the rear side of the solar module 1 and connected there to the partial module terminals 6.1 to 6.4 which protrude from the solar module 1.

Figure 2:
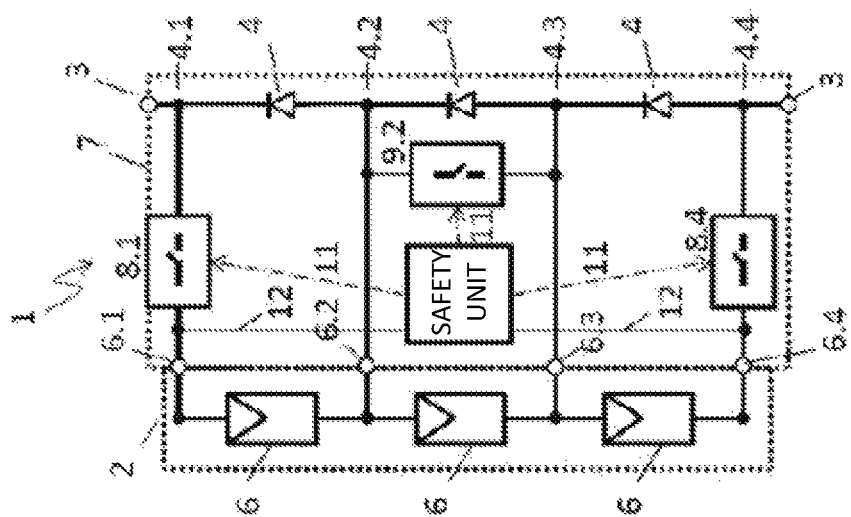
FIG. 2 shows a second embodiment according to the disclosure of a solar module.

A variant of a solar module 1 according to the disclosure is shown in FIG. 2. A further semiconductor switch 9.3 arranged in parallel with a further bypass diode 4 is provided instead of the semiconductor switch 8.4 from FIG. 1. The partial module terminal 6.4 is directly connected to the bypass connection 4.4. For simplified illustration, the safety unit 5 is not shown in FIG. 2 but should also be included. Redundant further semiconductor switches 9.2' and 9.3', which are likewise driven in the same way as the semiconductor switches 9.2 and 9.3 by the safety unit 5, can optionally be respectively connected in parallel with the two semiconductor switches 9.2 and 9.3 arranged in parallel with bypass diodes 4. The further semiconductor switches 9.2' 9.3' serve to ensure that no voltage is produced between the solar module connections 3 even in the event of failure of the semiconductor switch 9.2 and 9.3 respectively connected in parallel. The further semiconductor switches 9.2' 9.3' can be jointly actuated with the semiconductor switches 9.2 and 9.3 connected in parallel or can be actuated instead of said semiconductor switches if failure of the semiconductor switches 9.2 and/or 9.3 is established.

In the case of this arrangement of the semiconductor switches it is also ensured that a higher voltage than the open circuit voltage of a partial module 6 is not dropped across any of the semiconductor switches. At the same time, a supply voltage for the safety unit 5 can be produced from the series circuit 2 of the partial modules 6 even in the zero-voltage state of the solar module, so that an additional energy supply for the safety unit 5 does not have to be provided.

In all embodiments, the semiconductor switches connected in parallel with the bypass diodes 4 can also be closed in the operating situation when it is established that a current is flowing across the bypass diodes 4. Therefore, the thermal loading on the bypass diodes 4 produced can be reduced, as a result of which expenditure on cooling the module electronics can be eliminated or reduced.

Figure 3:
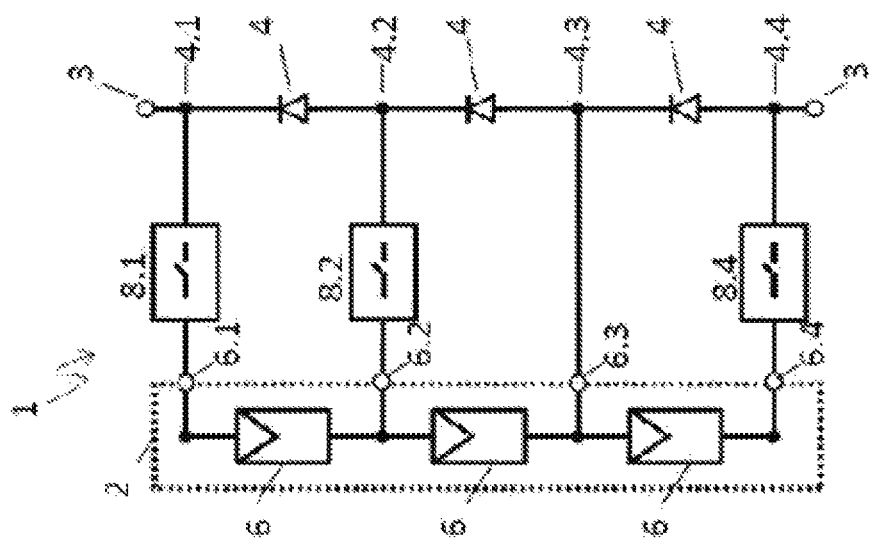
FIG. 3 shows a third embodiment according to the disclosure of a solar module.

FIG. 3 shows an arrangement of three semiconductor switches 8.1, 8.2 and 8.4 all arranged in the respective connecting paths between the partial module terminals 6.1 to 6.4 and the bypass connections 4.1 to 4.4. In this embodiment, double the open circuit voltage of a module can be dropped across the semiconductor switch 8.1 unlike in the case of the semiconductor switches 8.2 and 8.4, this having to be taken into account when designing the semiconductor switches 8.1 to 8.4. In spite of this, a cost saving can be achieved due to more favorable semiconductor switches.

Figure 4:
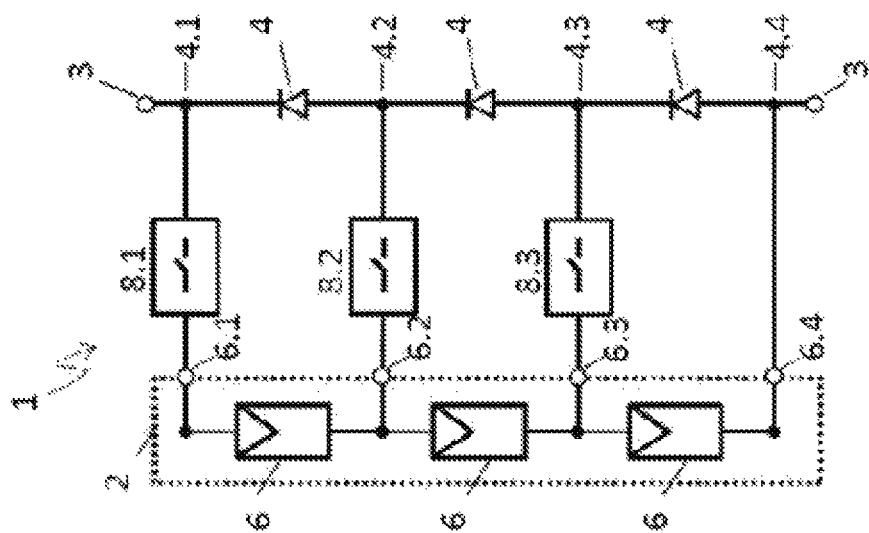
FIG. 4 shows a fourth embodiment according to the disclosure of a solar module.

The arrangement, shown in FIG. 4, of semiconductor switches 8.1 to 8.3 differs from the arrangement shown in FIG. 3 only in that the semiconductor switch 8.3 arranged between the partial module terminal 6.3 and the bypass connection 4.3 now replaces the semiconductor switch 8.4. As a result, the semiconductor switch 8.2 should be designed for double the open circuit voltage and the semiconductor switch 8.1 should be designed for three times the open circuit voltage of a solar partial module 6. A particular advantage of this arrangement is that all semiconductor switches 8.1 to 8.3 are at a potential above the potential across the bypass connection 4.4. As a result, it is particularly simple to generate the control voltages for the semiconductor switches by way of the safety unit 5.

Figure 5:
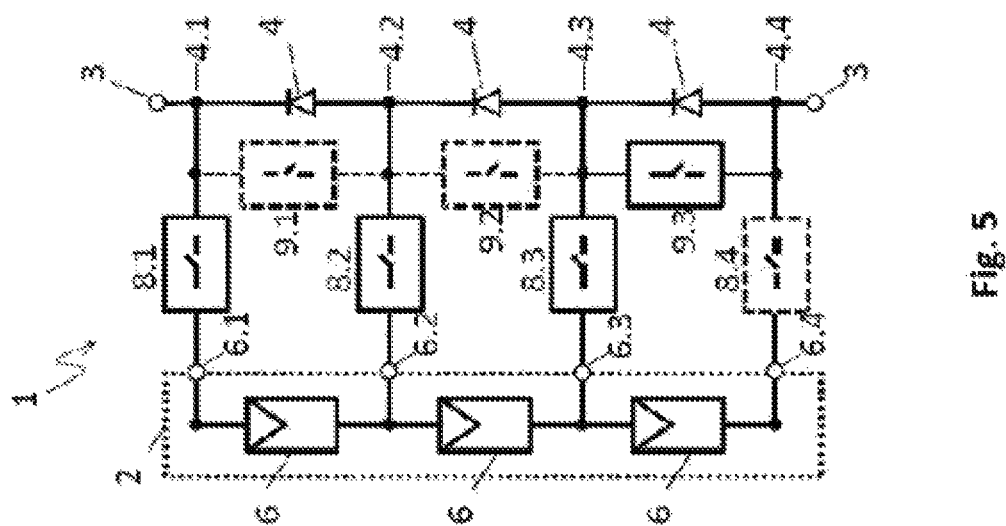
FIG. 5 shows a fifth embodiment according to the disclosure of a solar module.

Proceeding from the arrangement of the semiconductor switches from FIG. 4, one, two or three semiconductor switches 9.1, 9.2 and 9.3 each connected in parallel with a bypass diode 4 can be added in the embodiment according to FIG. 5. Furthermore, the semiconductor switch 8.4 from FIG. 3 can be added once again. As a result, the maximum voltage loading on the semiconductor switches 8.1 to 8.4 can be reduced and at the same time the operational reliability of the solar module 1 can be increased if the solar module 1 can be moved to a zero-voltage state. In particular, it is conceivable for the safety unit 5 to initially open those of the semiconductor switches 8.1 to 8.4 and close those of the semiconductor switches 9.1 to 9.3 that one of the switching configurations which can be realized by the embodiments described above with a small number of semiconductor switches for achieving a zero-voltage state is produced. The safety unit 5 then checks whether a zero-voltage state has been reached or, for example owing to a defective semiconductor switch, voltage is still applied to the solar module connections 3. If the latter situation occurs, the safety unit 5 changes over to another of the above-described switching configurations. This can be continued until a switching configuration which allows a zero-voltage state is found. The safety unit 5 can store the non-functional switching configurations, possibly report said non-functional switching configurations to a superordinate unit and not continue to use said non-functional switching configurations in the future.

In an example proceeding from a normal operating state of the solar module 1, in which the semiconductor switches 8.1 to 8.4 are closed and the semiconductor switches 9.1 to 9.3 are open, the safety unit 5 can, when a changeover to a zero-voltage state is required, initially open the semiconductor switches 8.1 and 8.4 and close the semiconductor switch 9.2 and thereby arrive at the switching configuration disclosed in FIG. 1. If a zero-voltage state cannot be achieved in this way, the safety unit closes the switch 9.3 and thereby arrives at the switching configuration according to FIG. 2. Therefore, successive further switching combinations for achieving a zero-voltage state can be assumed until a configuration in which all semiconductor switches 9.1 to 9.4 are closed and all semiconductor switches 8.1 to 8.4 are open is reached. Therefore, the solar module 1 can also be moved to a zero-voltage state when one or more components of the module electronics are not functioning correctly.

The invention claimed is:

1. A solar module, comprising:
   a series circuit of bypass diodes, which is arranged between solar module connections, wherein the bypass diodes each have bypass connections at both ends thereof;
   a series circuit of solar partial modules having partial module terminals at both ends and all connecting points of the series circuit of solar partial modules,
   wherein each bypass diode is associated with precisely one solar partial module;
   a safety circuit connected to the partial module terminals at respective ends of the series circuit of solar partial modules, thereby creating a parallel connection between the safety circuit and the series circuit of solar partial modules;
   a plurality of semiconductor switches, comprising:
      two or more first semiconductor switches; and
      one or more second semiconductor switches;
   wherein each of the two or more first semiconductor switches connect one of the bypass connections to one of the partial module terminals,
   wherein each of the one or more second semiconductor switches is connected in parallel with one of the bypass diodes, and
   wherein the two or more first semiconductor switches and the one or more second semiconductor switches are configured to jointly disconnect the solar module connections from an associated partial module terminal when a disconnection signal is received by the safety circuit, thereby preventing a voltage generated by a solar partial module associated with the associated partial module terminal from being applied to the respective solar module connection, and
   wherein each of the two or more first semiconductor switches and each of the one or more second semiconductor switches are configured to selectively switch a solar partial module associated therewith into a voltage-free or current-free state.

2. The solar module as claimed in claim 1, comprising precisely three solar partial modules in the series circuit of solar partial modules.

3. The solar module as claimed in claim 1, wherein a total number of first and second semiconductor switches of the two or more first semiconductor switches and the one or more second semiconductor switches corresponds to a total number of solar partial modules.

4. The solar module as claimed in claim 1, wherein at least one first semiconductor switch is directly connected to one of the solar module connections.

5. The solar module as claimed in claim 1, wherein the bypass connections at both ends of a bypass diode of the series circuit of bypass diodes are in each case directly connected to the partial module terminals of the solar partial module associated with the bypass diode, and wherein the bypass diode is connected in parallel with one of the second semiconductor switches.

6. The solar module as claimed in claim 1, wherein the one or more second semiconductor switches comprise two semiconductor switches connected in parallel.

7. An energy-generating system comprising a series circuit of solar modules, wherein each solar module comprises:
a series circuit of bypass diodes, which is arranged between solar module connections, wherein the bypass diodes each have bypass connections at both ends thereof;
a series circuit of solar partial modules having partial module terminals at both ends and all connecting points of the series circuit of solar partial modules,
wherein each bypass diode is associated with precisely one solar partial module;
a safety circuit connected to the partial module terminals at respective ends of the series circuit of solar partial modules, thereby creating a parallel connection between the safety circuit and the series circuit of solar partial modules;
a plurality of semiconductor switches, comprising:
two or more first semiconductor switches; and
one or more second semiconductor switches;
wherein each of the two or more first semiconductor switches connect one of the bypass connections to one of the partial module terminals,
wherein each of the one or more second semiconductor switches is connected in parallel with one of the bypass diodes, and
wherein the two or more first semiconductor switches and the one or more second semiconductor switches are configured to jointly disconnect the solar module connections from an associated partial module terminal when a disconnection signal is received by the safety circuit, thereby preventing a voltage generated by a solar partial module associated with the associated partial module terminal from being applied to the respective solar module connection, and
wherein each of the two or more first semiconductor switches and each of the one or more second semiconductor switches are configured to selectively switch a solar partial module associated therewith into a voltage-free or current-free state.

8. The solar module as claimed in claim 1, wherein the safety circuit is configured to receive an energy supply from one or more of the solar partial modules.

9. The solar module as claimed in claim 8, wherein the safety circuit is configured to receive the energy supply from one or more of the solar partial modules when the solar module is in a zero voltage or zero current state.

10. The solar module as claimed in claim 1, wherein at least one bypass connection of a bypass diode is directly connected to an associated partial module terminal.

11. The solar module as claimed in claim 1, wherein the safety circuit is connected to at least one of the bypass connections by means of one of the first semiconductor switches.

12. The solar module as claimed in claim 1, wherein each solar partial module of the series circuit of solar partial modules has at least one first semiconductor switch connected in series with the solar partial module, or at least one second semiconductor switch connected in parallel with the solar partial module, wherein the two connections are not mutually exclusive.

13. A solar module, comprising:
a safety circuit;
a series circuit of bypass diodes, which is arranged between solar module connections, wherein the bypass diodes each have bypass connections at both ends thereof;
a series circuit of solar partial modules having partial module terminals at both ends and all connecting points of the series circuit of solar partial modules,
wherein each bypass diode is associated with precisely one solar partial module, and
a plurality of semiconductor switches configured to disconnect the solar module connections from an associated partial module terminal when a disconnection signal is received by the safety circuit, thereby preventing a voltage generated by a solar partial module associated with the associated partial module terminal from being applied to the respective solar module connection,
wherein each of the plurality of semiconductor switches is configured to switch a solar partial module associated therewith into a voltage-free or current-free state,
wherein a total number of semiconductor switches is equal to a total number of solar partial modules, and
wherein at least one bypass connection of one bypass diode is directly connected to an associated partial module terminal and at least another bypass connection of the one or another bypass diode is connected to an associated partial module terminal by means of one of the semiconductor switches.

14. The solar module as claimed in claim 1, wherein a total number of semiconductor switches of the plurality of semiconductor switches corresponds to a total number of solar partial modules.

15. The solar module as claimed in claim 1, wherein a maximum voltage loading any of the first semiconductor switches or any of the second semiconductor switches is an open circuit voltage of a single solar partial module.

16. The energy-generating system as claimed in claim 7, wherein a total number of first and second semiconductor switches of the two or more first semiconductor switches and the one or more second semiconductor switches corresponds to a total number of solar partial modules.

17. The energy-generating system as claimed in claim 7, wherein a total number of semiconductor switches of the plurality of semiconductor switches corresponds to a total number of solar partial modules.

18. The solar module as claimed in claim 9, wherein the energy supply is supplied via the parallel connection between the safety circuit and the series circuit of solar partial modules.

19. A solar module, comprising:
a series circuit of bypass diodes, which is arranged between solar module connections, wherein the bypass diodes each have bypass connections at both ends thereof;
a series circuit of solar partial modules having partial module terminals at both ends and all connecting points of the series circuit of solar partial modules,
wherein each bypass diode is associated with precisely one solar partial module;
a safety circuit connected to the partial module terminals at respective ends of the series circuit of solar partial modules, thereby creating a parallel connection between the safety circuit and the series circuit of solar partial modules;
a plurality of semiconductor switches, comprising:
one or more first semiconductor switches; and
one or more second semiconductor switches;

wherein the total number of first and second semiconductor switches of the one or more first semiconductor switches and the one or more second semiconductor switches exactly corresponds to a total number of solar partial modules, wherein each of the one or more first semiconductor switches connect one of the bypass connections to one of the partial module terminals, wherein each of the one or more second semiconductor switches is connected in parallel with one of the bypass diodes, and wherein the one or more first semiconductor switches and the one or more second semiconductor switches are configured to jointly disconnect the solar module connections from an associated partial module terminal when a disconnection signal is received by the safety circuit, thereby preventing a voltage generated by a solar partial module associated with the associated partial module terminal from being applied to the respective solar module connection, and wherein each of the one or more first semiconductor switches and each of the one or more second semiconductor switches are configured to selectively switch a solar partial module associated therewith into a voltage-free or current-free state.

* * * * *